United States Patent [19]
Kikugawa

[11] Patent Number: 5,903,197
[45] Date of Patent: May 11, 1999

[54] PHASE-LOCKED LOOP CIRCUIT

[75] Inventor: Hirohisa Kikugawa, Tokyo, Japan

[73] Assignee: Nippon Precision Circuits Inc., Tokyo, Japan

[21] Appl. No.: 09/041,466

[22] Filed: Mar. 12, 1998

[30] Foreign Application Priority Data

Mar. 17, 1997 [JP] Japan ..................................... 9-062691

[51] Int. Cl.⁶ ........................... H03L 7/089; H03L 7/095; H03L 7/18
[52] U.S. Cl. ................................ 331/17; 331/1 A; 331/8; 331/16; 331/17; 331/DIG. 2; 327/157; 327/159; 455/260
[58] Field of Search .................................. 331/1 A, 4, 8, 331/16, 17, 18, 25, DIG. 2; 327/156–159; 375/376; 455/260

[56] References Cited

U.S. PATENT DOCUMENTS

| | | | |
|---|---|---|---|
| 4,437,072 | 3/1984 | Asami ........................................ | 331/1 A |
| 4,543,540 | 9/1985 | Linder ....................................... | 331/1 A |
| 4,562,411 | 12/1985 | O'Rourke et al. ....................... | 331/1 A |
| 4,614,917 | 9/1986 | Zelitzki .................................... | 331/1 A |
| 5,276,408 | 1/1994 | Norimatsu ................................. | 331/8 |

*Primary Examiner*—David Mis
*Attorney, Agent, or Firm*—Jordan and Hamburg LLP

[57] ABSTRACT

A phase-locked loop (PLL) circuit capable of attaining high-speed frequency transition with enhanced reliability. To this end, outputs of a reference signal source (1) and voltage-controlled oscillator (VCO) circuit (3) are frequency-divided by frequency divider circuits (2, 4), respectively. A phase comparator circuit (5) is provided for outputting an error signal indicative of a phase difference between these signals, if any. A window generator circuit (9) is connected for outputting a window signal; where the error signal does not fall within the range of a pulse width of this window signal, a level generator circuit generates a boost voltage having its potential near the control voltage value of the VCO (3) for use in generating of a target frequency. A low-pass filter (LPF) circuit (7) is charged up in responding to receipt of both the output signal of the charge pump circuit (6) and the boost voltage so that the control voltage may rapidly increase in potential at a target value without rising up to any excess values. Whereby, undershoot and overshoot may be eliminated or at least greatly suppressed thus enabling achievement of high-speed frequency transition with increased reliability.

5 Claims, 11 Drawing Sheets

PHASE-LOCKED LOOP CIRCUIT

BACKGROUND OF THE INVENTION

1. Field of the Invention

The present invention relates to phase-locked loop (PLL) circuitry.

2. Description of the Prior Art

Currently, in PLL circuits adaptable for use with PLL frequency synthesizers in mobile communications systems or the like, several attempts have been made to shorten the lock-up time in start-up and channel switching events.

Figure 12A:
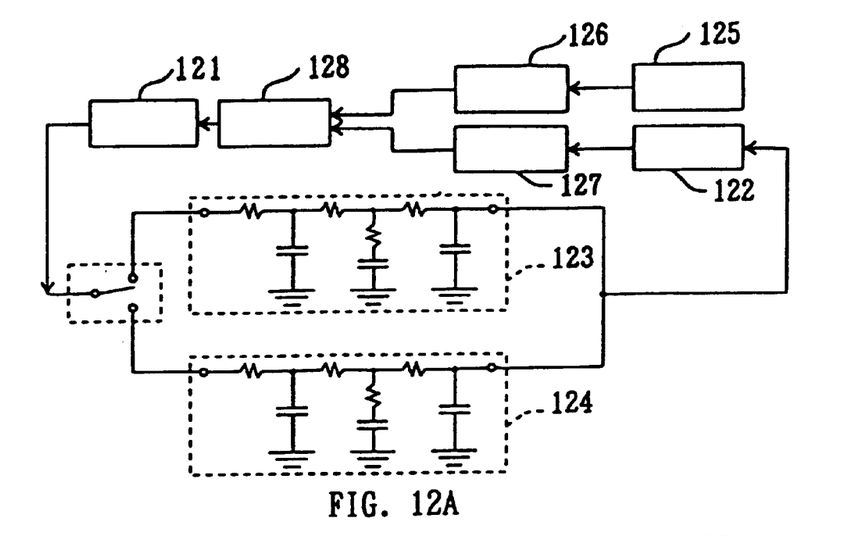
FIGS. 12A to 12C are diagrams each for explanation of a configuration of a prior art PLL circuit.

One exemplary prior known circuitry is shown in FIG. 12A, wherein two low-pass filters (LPFs) 123 and 124 of different time constants are provided as an LPF known as the "loop filter" which operates to average an output of a charge pump circuit 121 thereby generating a control voltage for use in controlling the frequency of a voltage-controlled oscillator (VCO) circuit 122. This circuit is for shortening the time duration as required for loop stabilization by using only one LPF 123 of less time constant during a frequency transition period and for, after lock-up, switching it to the remaining LPF 124 of greater time constant. Additionally, reference numeral 125 designates a reference signal source; numerals 126 and 127 denote frequency divider circuits for frequency-dividing the outputs of such reference signals source 125 and VCO 122, respectively; and, 128 indicates a phase comparator circuit.

Figure 12B:
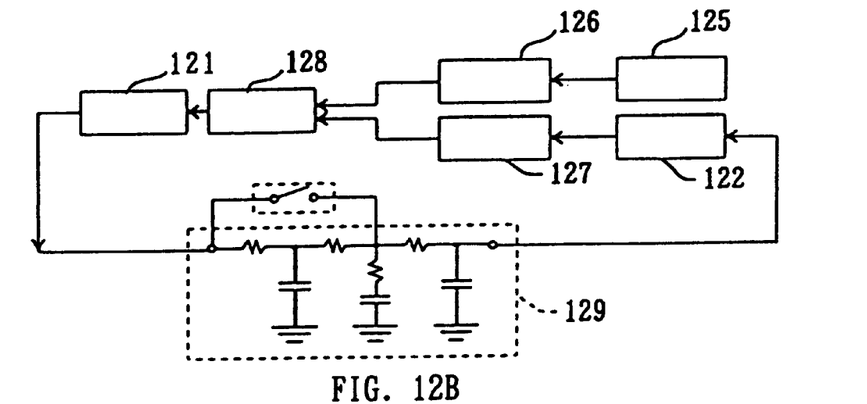

Another prior art circuitry is shown in FIG. 12B, which is designed to reduce the time constant in frequency transition events by use of an LPF 129 of variable time constant.

A still another prior art is known which provides two charge pump circuits as different from each other in ability to supply charge carriers to the loop filter, although such configuration is not illustrated herein. This is configured to cause, when the frequency of an output of the VCO is far from a target frequency also called the "lock frequency," one charge pump circuit of high charge supply ability to effectuate charging and discharging of carriers to and from the loop filter circuit thus allowing the VCO output to rapidly approach the lock frequency or nearby frequencies, and thereafter cause the other charge pump of less charge supply ability to become operative performing precise adjustment of the frequency value.

Figure 12C:
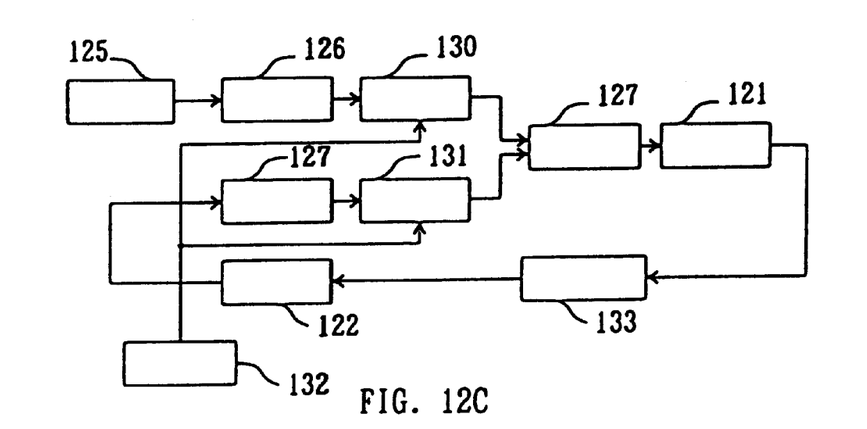

A further prior art shown in FIG. 12C is such that it includes frequency divider circuits 130, 131 which are provided in addition to the frequency dividers 126, 127 for controlling comparison frequency value to be compared at the phase comparator 128, and a control circuit 132 for controlling the frequency division ratio of them, wherein the comparison frequency value is temporarily higher than the ordinary or standard frequency value when the frequency transition gets started thus shortening the lockup time while attaining a channel switching operations by locking at the standard frequency. Note here that numeral 23 designates an LPF.

However, the scheme switching the aforesaid loop filter circuit or charge pump circuit suffers from difficulty of correct determination as to such switch timing. For this reason, circuitry for generating a signal for the switching increases in scale while at the same time associating the risk of occurrence of fluctuation in frequency due to noises in switching events. Further, the prior art as designed to switch between loop filter circuits should require the use of two different types of loop filter circuits causing its circuit area to increase undesirably. With the prior art that switches to and from the charge pump circuit, the charge supply ability-increased charge pump circuit per se can be sensitive to noises occurring in the PLL system badly behaving to affect the loop filter.

The prior art as designed to temporarily increase the comparison frequency at the beginning of the frequency transition requires use of extra frequency dividers 130, 131 for increasing the comparison frequency. A further problem associated with this prior art is that the PLL system can be disturbed at an instant when the comparison frequency used at the beginning of the transition is switched to standard frequency for the channel switching.

SUMMARY OF THE INVENTION

It is therefore an object of the present invention to provide phase-locked loop (PLL) circuitry capable of avoiding the problems encountered with the prior art.

It is another object of the invention to provide a PLL circuit with high-speed frequency transition with enhanced reliability.

To attain the foregoing objects, the instant invention provides a specific phase-locked loop (PLL) circuit employing therein a control circuit other than the charge pump circuit(s), wherein the control circuit is connected for applying a boost voltage to the capacitive element in an integration circuit of an LPF for generating an output control voltage, in response to a phase difference as output from a phase comparator circuit, thereby enabling achievement of high-speed and more stable frequency transition.

The PLL circuit is constructed from a reference signal source for generating a reference frequency signal, a first frequency divider circuit for frequency-dividing the reference frequency signal as output from the reference signal source, a voltage-controlled oscillator circuit for outputting a signal with frequency determinable depending upon a control voltage, a second frequency divider circuit for frequency-dividing the output signal of the voltage-controlled oscillator circuit, a phase comparator circuit that compares in phase respective output signals of the first and second frequency divider circuits to thereby output an error signal having its pulse width corresponding to a phase difference detected, a charge pump circuit that is driven in response to the error signal as output from the phase comparator circuit, a low-pass filter (LPF) which has an integration circuit and averages the output of the charge pump circuit to output an averaged signal as the control voltage, and a control circuit which monitors the error signal and applies an appropriate boost voltage, which may correspond to the resulting phase difference to a capacitive element of the integration circuit of the LPF, in response to occurrence of a phase difference greater than or equal to a predetermined value.

Here, the control circuit is preferably arranged so as to generate, when the pulse width of the error signal becomes greater than or equal to a predetermined value, the boost voltage having a value that approximates a control voltage value as used for causing the voltage-controlled oscillator circuit to oscillate at a target frequency.

It may also be preferable that the control circuit is arranged to generate a window signal used for a pulse-width comparison of the error signal, and generate, when the comparison of this window signal with the error signal tells that the pulse width of the error signal is greater than or equal to a predetermined value, the boost voltage based on predetermined level-set data in order to set the boost voltage at an adequate value near or around the control voltage value for use in letting the voltage-controlled oscillator circuit oscillate at the target frequency.

Still preferably, the control circuit may include a storage or "memory" circuit that stores therein the level-set data along with certain set data such as the frequency division ratio of the first frequency divider circuit and/or second frequency divider circuit, thereby offering capability of setting both such frequency division ratio(s) and setting of the boost voltage.

Furthermore, it may also be preferable to provide a PLL circuit including a reference signal source for generating a reference frequency signal, a first frequency divider circuit for frequency-dividing the reference frequency signal as output from the reference signal source, a voltage-controlled oscillator circuit for outputting a signal with a specific frequency determinable depending upon a control voltage, a second frequency divider circuit for frequency-dividing the output signal of the voltage-controlled oscillator circuit, a phase comparator circuit for comparing in phase respective output signals of the first and second frequency divider circuits with each other to thereby output an error signal having its pulse width corresponding to a phase difference detected, a charge pump circuit driven in response to the error signal as output from the phase comparator circuit, an LPF that has an integration circuit and is operable to average the output of the charge pump circuit then outputting an averaged signal as the control voltage, and a control circuit which monitors the error signal and applies a boost voltage to a capacitive element of the integration circuit of the LPF during a time duration in which the phase difference is above a predetermined value, and eliminates the application of the boost voltage even where the phase difference again goes beyond the predetermined value after interruption of the boost voltage application.

These and other objects, features and advantages of the invention will be apparent from the following more particular description of preferred embodiments of the invention, as illustrated in the accompanying drawings.

DETAILED DESCRIPTION OF THE INVENTION

Figure 1:
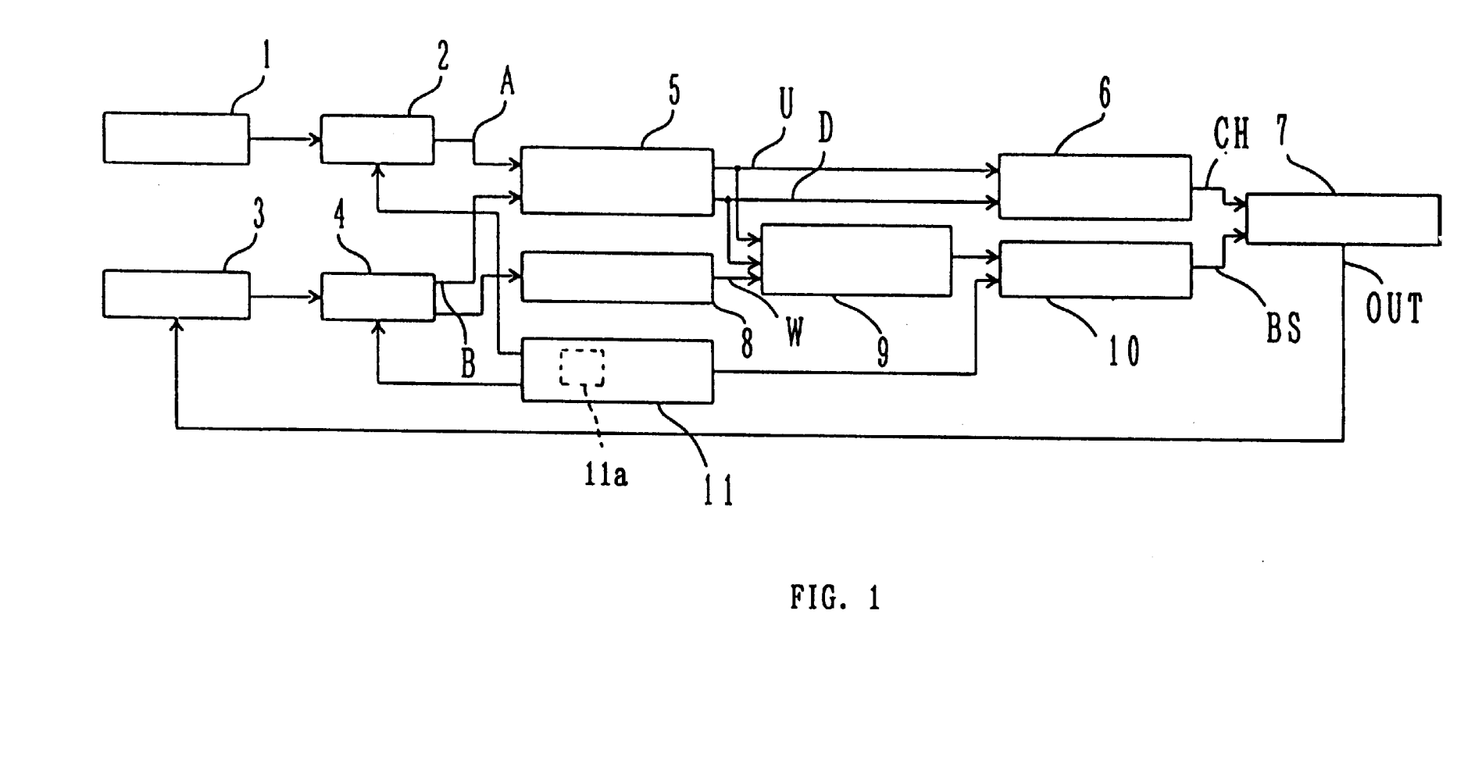
FIG. 1 is a diagram for explanation of a configuration of a phase-locked loop (PLL) circuit in accordance with a first embodiment of the present invention.

An explanation will next be given of a phase-locked loop (PLL) circuit in accordance with a first embodiment of the present invention. FIG. 1 is a diagram for explanation of a configuration of the first embodiment of the invention. In the drawing, reference numeral 1 designates a reference signal source which generates and issues a signal that may act as the reference. Numeral 2 indicates a frequency divider circuit which is for frequency-dividing the signal as output from the reference signal source 1. Numeral 3 denotes a voltage-controlled oscillator (VCO) circuit which operates to output a signal with a frequency determinable in conformity with the value of a control voltage being applied to a control terminal. Numeral 4 shows a frequency divider circuit which frequency-divides the output signal of the VCO 3. Numeral 5 is a phase comparator circuit which is operable to compare output signals A and B of the frequency divider circuits 2, 4 to each other for outputting at terminals U, D error signals having a pulse width corresponding to a phase difference detected. More specifically, when the signal A advances in phase with respect to the signal B, then output at the terminal U an error signal corresponding to such resultant phase difference; adversely, when the former is delayed in phase relative to the latter, output a corresponding error signal from the terminal D. Numeral 6 is a charge pump circuit which includes a series interconnection of a P-channel metal oxide semiconductor (PMOS) transistor and an N-channel MOS (NMOS) transistor with their drain electrodes being connected together between power supply terminals VDD (5V) and VSS (0V) not depicted herein and with the drains thereof coupled together at a connection node that may serve as an output terminal, the gates of such PMOS transistor and NMOS transistor being driven to turn on and off in response to respective output signals at the U terminal and D terminal of the phase comparator 5.

Figure 2:
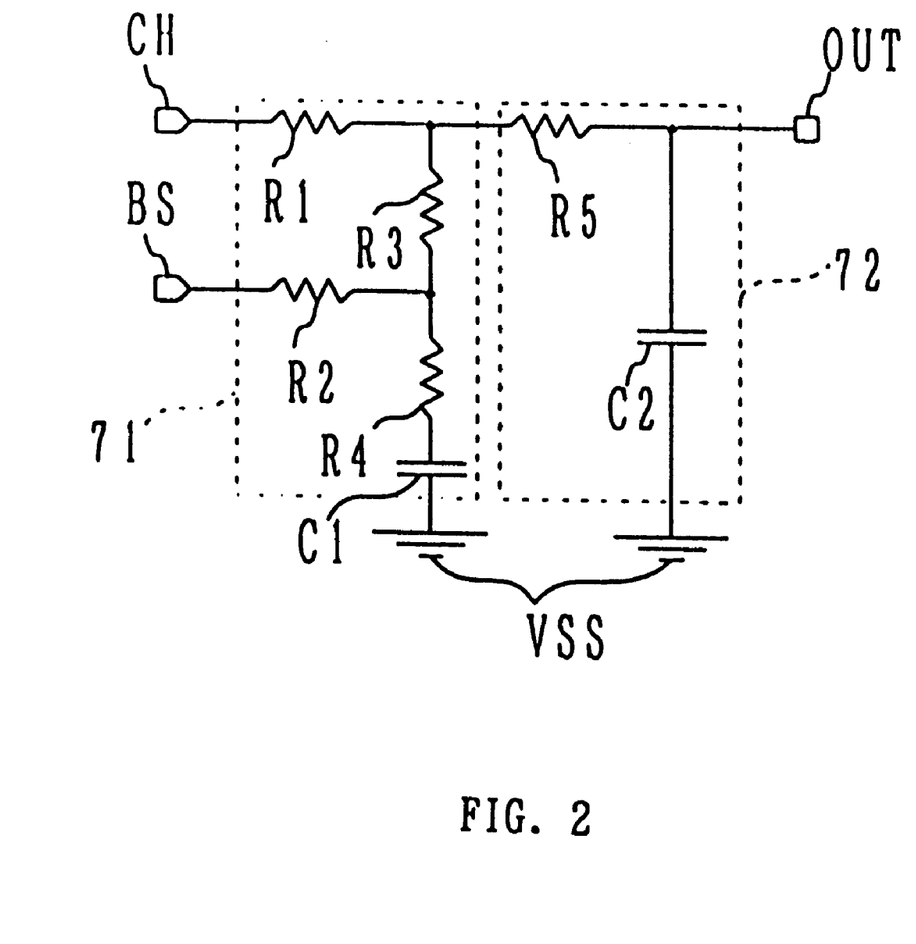
FIG. 2 is a diagram for explanation of a configuration of main part of the circuitry of FIG. 1.

Numeral 7 designates a low-pass filter (LPF) circuit which operates to average an output signal of the charge pump 6 for outputting the resultant averaged signal as a control voltage. One practical circuit configuration is shown in FIG. 2. Here, it consists essentially of two stages of integration circuits 71, 72. The first stage integrator 71 may consist of resistors R1 to R4 and a capacitive element C1 allowing the output of charge pump 6 to be applied to one terminal CH of resistor R1, while causing a later-described boost voltage to be applied to one terminal BS of resistor R2. The second stage integrator 72 includes a resistor R5 and a capacitive element C2 providing a control voltage at its output terminal OUT.

Numeral 8 denotes a window generator circuit which outputs a window signal having its pulse width with the falling edge of the signal B as input to the phase comparator 5 being as its center. More specifically, generation of the window signal is done by waveform-shaping an intermediate signal of frequency-division stages of the frequency divider 4. Note here that while the output window signal has its pulse width in which the falling edge of signal B is centrally placed defining the center point thereof, the window generator may optionally be designed in a way such that it outputs a window signal with the falling edge of the signal A being as the center thereof.

Numeral 9 indicates a boost generator circuit that is responsive to receipt of the window signal and error signals U, D for generating a boost signal in cases where the error signals do not fall within the pulse width of the window signal or alternatively interrupting generation of the boost signal where the error signals are within the window-signal pulse width. In other words, let the state of its output terminal be of high impedance for the interrupting. Here, the circuit is designed to generate "H" and "L" state signals with respect to the error signals from the terminals U, D.

Numeral 10 is a level generator circuit which is responsive to the boost signal as output from the boost generator 9 for outputting a boost voltage with a voltage value determinable in reference to level-set data, which are preset together with the frequency division data for use in changing or modifying the oscillation frequency. To be more specific, there is generated as the boost voltage a specific voltage having its voltage value approximating the control voltage adaptable for use in letting the VCO 3 oscillate at a target frequency.

Numeral 11 is an oscillation control circuit for forcing the VCO 3 to selectively oscillate at one of a plurality of different target frequencies; to this end, the control circuit comes with a storage unit 11a storing therein frequency division data and the level-set data with respect to each frequency, for outputting to the frequency dividers 2, 4 a frequency division set signal based on the frequency division data reflecting the target frequency in response to a frequency change command or instruction as fed from a control section not shown (for example, a control module of electronics equipment employing this embodiment) thereby to change or modify these frequency division ratio values while simultaneously outputting a level-set signal to the level generator 9 based on the level-set data thus forcing it to determine the value of the boost voltage.

Next, an operation of this embodiment will be explained hereafter with reference to the timing chart of FIG. 3.

Figure 3:
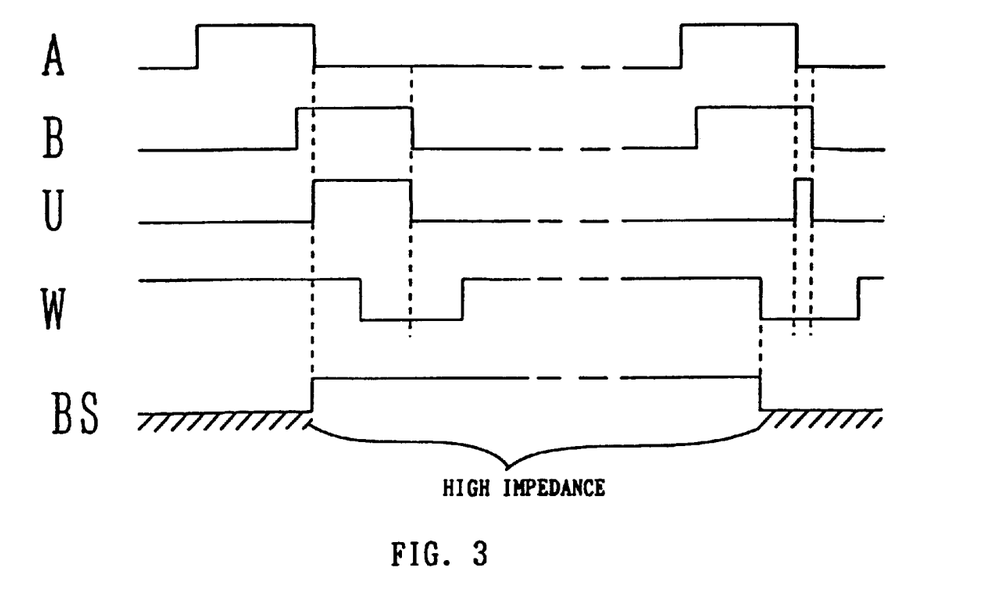
FIG. 3 is a timing chart for explanation of an operation of the circuit of FIG. 1.
Figure 4:
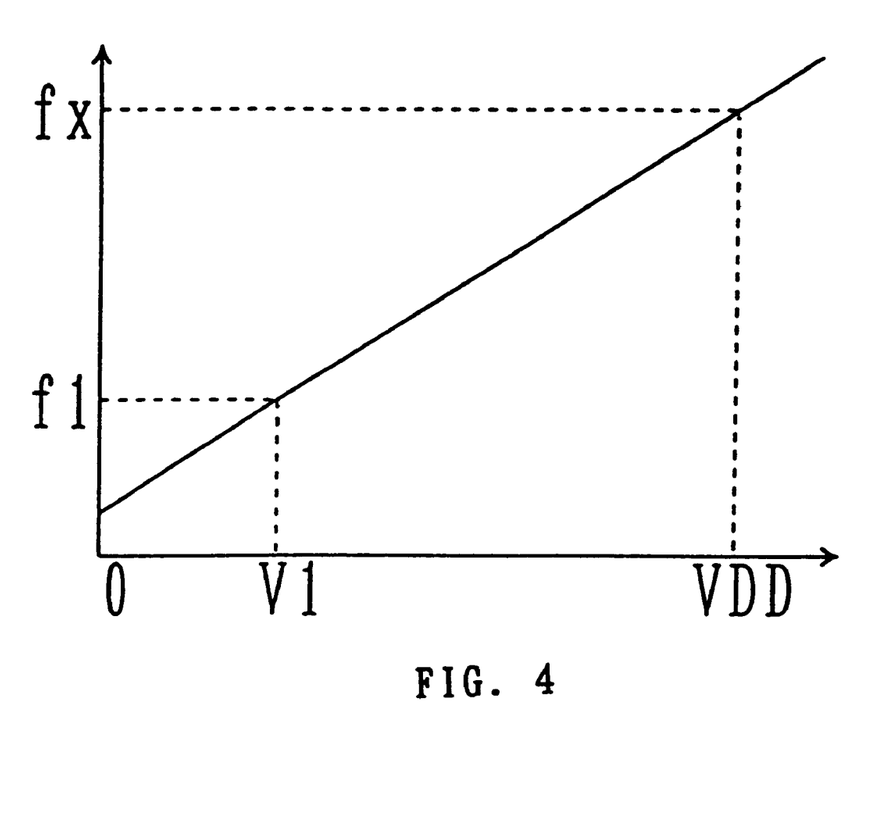
FIG. 4 is a graph for explanation of an operation of the FIG. 1 circuit.
Figure 5:
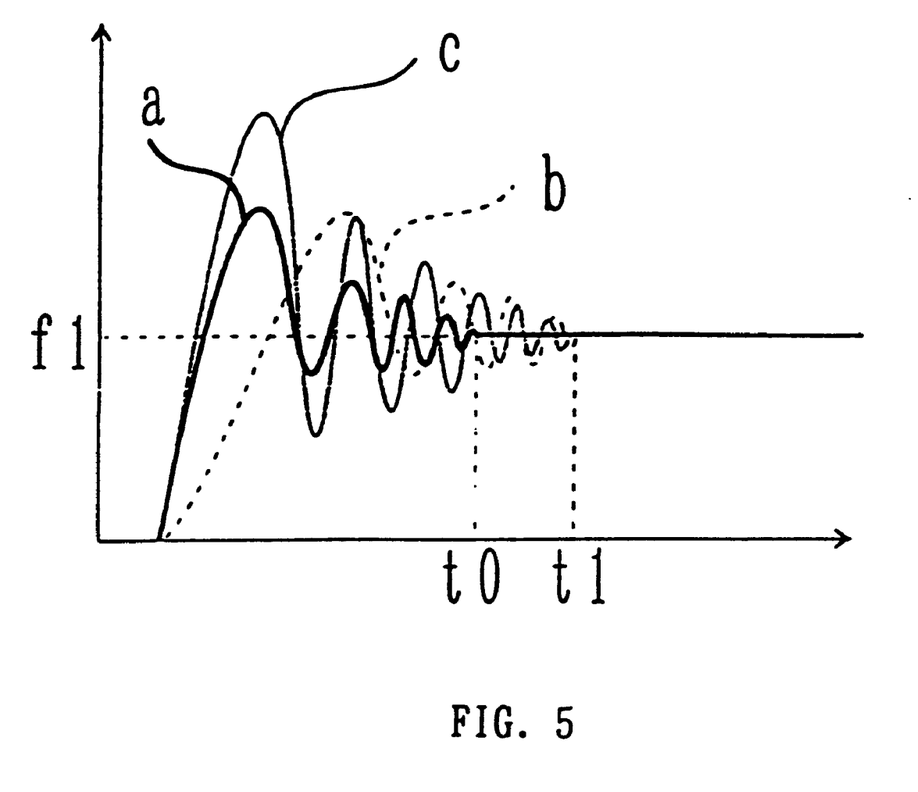
FIG. 5 is a graph for explanation of an operation of the FIG. 1 circuit.

FIG. 3 shows an oscillation-frequency transition state of the VCO 3, wherein the signals A, B—these have been frequency-divided from output signals of the reference signal source 1 and VCO 11 which are output from the frequency dividers 2, 4, respectively—are such that the signal B is delayed in phase relative to the signal A as shown by "A" and "B" of FIG. 3. The phase comparator 5 operates to compare between these signals A, B outputting an error signal U as shown by "U" in FIG. 3. In response to the error signal U, the charge pump 6 is rendered operative to charge up the capacitive elements C1, C2 of LPF 7. The window generator 8 outputs to the boost generator 9 a window signal W having the falling edge of signal B as its pulse width center as indicated by "W" in FIG. 3. Since the error signal U here falls outside the pulse width of window signal W, the boost generator 9 generates a boost signal in response to the error signal U. Upon receipt of the boost signal, the level generator 10 generates and issues at its output the boost voltage having its voltage value near or around the control voltage for use in making the VCO 3 oscillate at a target frequency, as shown by "BS" in FIG. 3. Assume that the target frequency is f1 as shown in FIG. 4, by way of example; if this is the case, the boost voltage is generated which has its voltage value approximating the control voltage value V1 as required for generation thereof. This boost voltage is then applied to the terminal BS of the LPF 7 shown in FIG. 3. Whereby, in the first stage integration circuit 71, the capacitor C1 is charged up by the boost voltage in addition to the output from charge pump 6 being applied to the terminal CH, thus causing the control voltage to rapidly increase in voltage value. Such increase in oscillation frequency of the VCO 3 may cause the phase difference between the signals A, B to decrease; when the error signal comes within the pulse width of the window signal, the boost voltage is interrupted letting the terminal BS be of high impedance. Thereafter, the control voltage continues potentially increasing due to charge-up by charge pump 6 alone to finally arrive at an appropriate control voltage value for generation of the target frequency; when this is done, the PLL circuit of this embodiment locks up. The graph of FIG. 5 demonstrates by a curve labeled "a" the frequency versus time relation when the boost voltage is used, and also shows by curve "b" such relation when the boost voltage is of no use. With the curve "a," since the PLL is subject to lock-up by charge pump 6 after forcing its frequency to rapidly rise by use of the boost voltage thus approaching the target frequency f1, the lockup becomes faster than that in the case "b" where the boost voltage is not used. The lockup in the case "a" is effectuated at a time point t0 whereas the lockup in the case "b" is at t1.

It should be noted that where the signal B advances signal A in phase and yet the error signal D does not fall within the pulse width of window signal W, a boost voltage of "L" level is generated causing the level generator 10 receiving this signal to regard this boost voltage as a voltage at the power supply terminal VSS whereby the frequency rapidly decreases so that the aforesaid signal B is behind the signal A in phase permitting execution of the operation stated supra.

As apparent from the foregoing, the illustrative embodiment is specifically arranged to rapidly increase the control voltage by use of the boost voltage in addition to an output of the charge pump 6 at the beginning of frequency transition and thereafter increase the control voltage using only the charge pump circuit 6 with more fine accuracy. Accordingly, it becomes possible to obtain an intended control voltage value adequate for attainment of the target frequency with increased speed and enhanced accuracy, which in turn enables the PLL circuit of this embodiment to rapidly locked up. Note here that where the boost voltage is set at VDD in value when the target frequency is f1, it will possibly occur that the charging to the capacitor C1 becomes too significant in amount causing the VCO 3 to operate at or near an excess frequency fx higher than the frequency f1. Due to this, as shown by "c" in FIG. 5, overshooting and undershooting that attempts to compensate for the former become too large increasing a time taken for convergence, which does not shorten the lockup time. In view of this, the illustrative embodiment is configured such that the boost voltage is set at a selected value near or around the control voltage value as required for generation of the target frequency while making use of this boost voltage only when the error signal exceeds a predetermined pulse width. Additionally, comparing the window signal to the error signal and exclusively using the boost voltage only when required may contribute to suppression of occurrence of overshoot and undershoot.

It should also be noted that the value of the boost voltage in this embodiment is set at certain value near or around the control voltage value required for generation of the target frequency but not identical to the exact control voltage value per se; the boost voltage may vary in value depending upon the characteristics (responsibility, for example) of VCO 3 and the configuration of LPF used as well as the time constant so that it may be set at an appropriate value by taking account of respective frequencies on a case-by-case bases. Such boost voltage setting is to be done simultaneously upon setting of the frequency division data concerned. Generally speaking, the data used in the PLL circuit when transition of frequency may contain three kinds of items: frequency division set data for the frequency divider circuit(s) with respect to the reference signal source, frequency division set data for the frequency divider circuit(s) with respect to the VCO and function set data, these data being preset for every frequency and stored in the storage section of a control circuit for controlling the PLL operations (in this embodiment, a memory unit not shown within the oscillation controller 11). In addition, both the setting of frequency division ratio of each frequency divider circuit with respect to the reference signal source and the function setting are performed at a time; especially, the frequency as set by the frequency division ratio of each frequency divider circuit with respect to the reference signal source (the frequency of the signal A in this embodiment) will never be modified once after it was initially set in ordinary cases. In contrast, the setting of the frequency division ratio of each frequency divider circuit with respect to the VCO is done every time when the frequency is changed. To this end, the illustrative embodiment is arranged to store therein a specific data bit for use in setting the boost voltage in addition to the data bit for setting of the frequency division ratio of frequency divider 4 relative to VCO 3, read it ever time when a frequency change is done, and simultaneously perform setting of the level generator 7 upon setting of frequency divider 4. In this way, this embodiment is capable of setting an optimal boost voltage with respect to each frequency and hence shortening the lockup time over the almost entire frequency band of VCO 3. Furthermore, during the course of designing the PLL circuit, any possible change or alteration of specification of the VCO circuit used therein may be accommodatable by simply modifying the preset value of boost voltage while minimizing specification alteration of parts other than the VCO, which in turn leads to a reduction in cost.

It should further be noted that while the first embodiment is arranged so that the boost voltage is set by the level generator 10, the invention should not exclusively be limited thereto and may be modified in a way such that the boost voltage is fixed at a single predetermined value or alternatively the use of such boost voltage is rendered conditional by adding some limitations thereto. A PLL circuit in accordance with a second embodiment of the invention which employs this approach will be described below.

Figure 6:
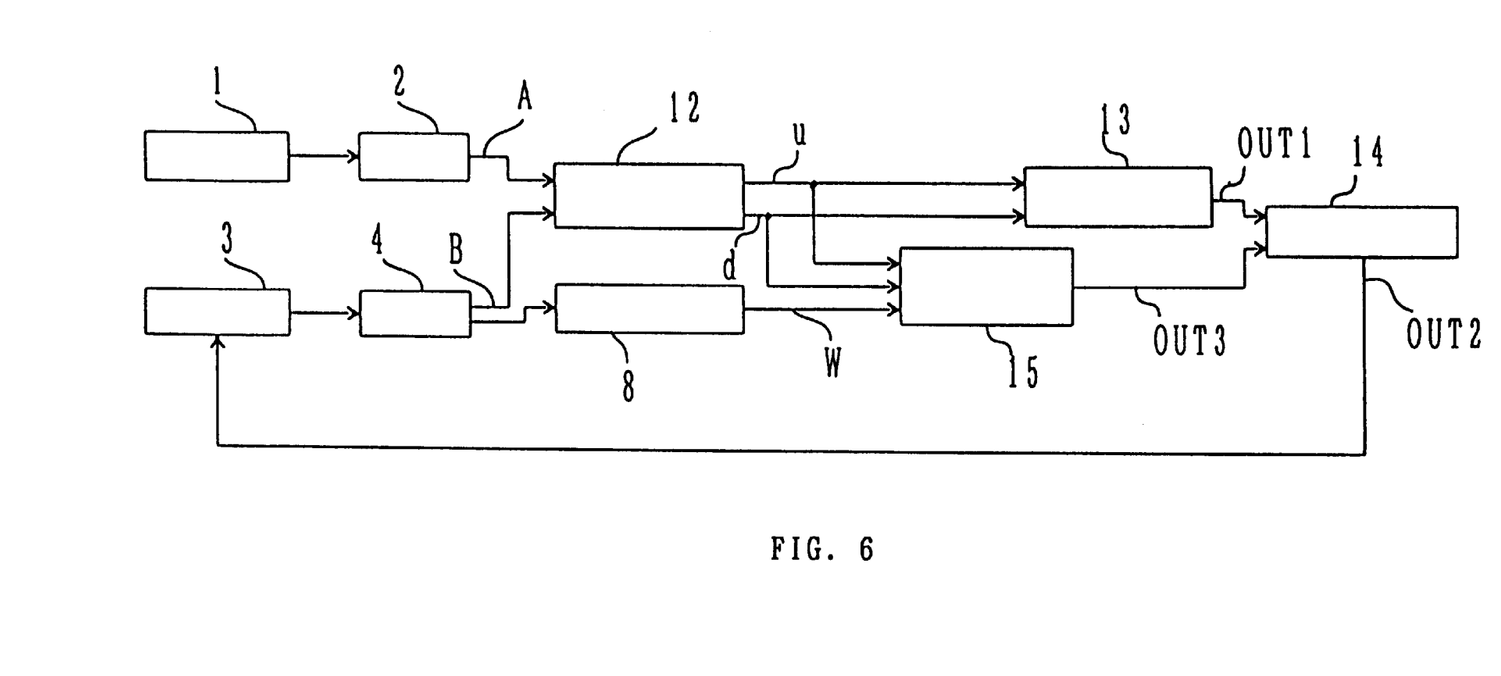
FIG. 6 is a diagram for explanation of a configuration of a PLL circuit in accordance with a second embodiment of the invention.
Figure 7:
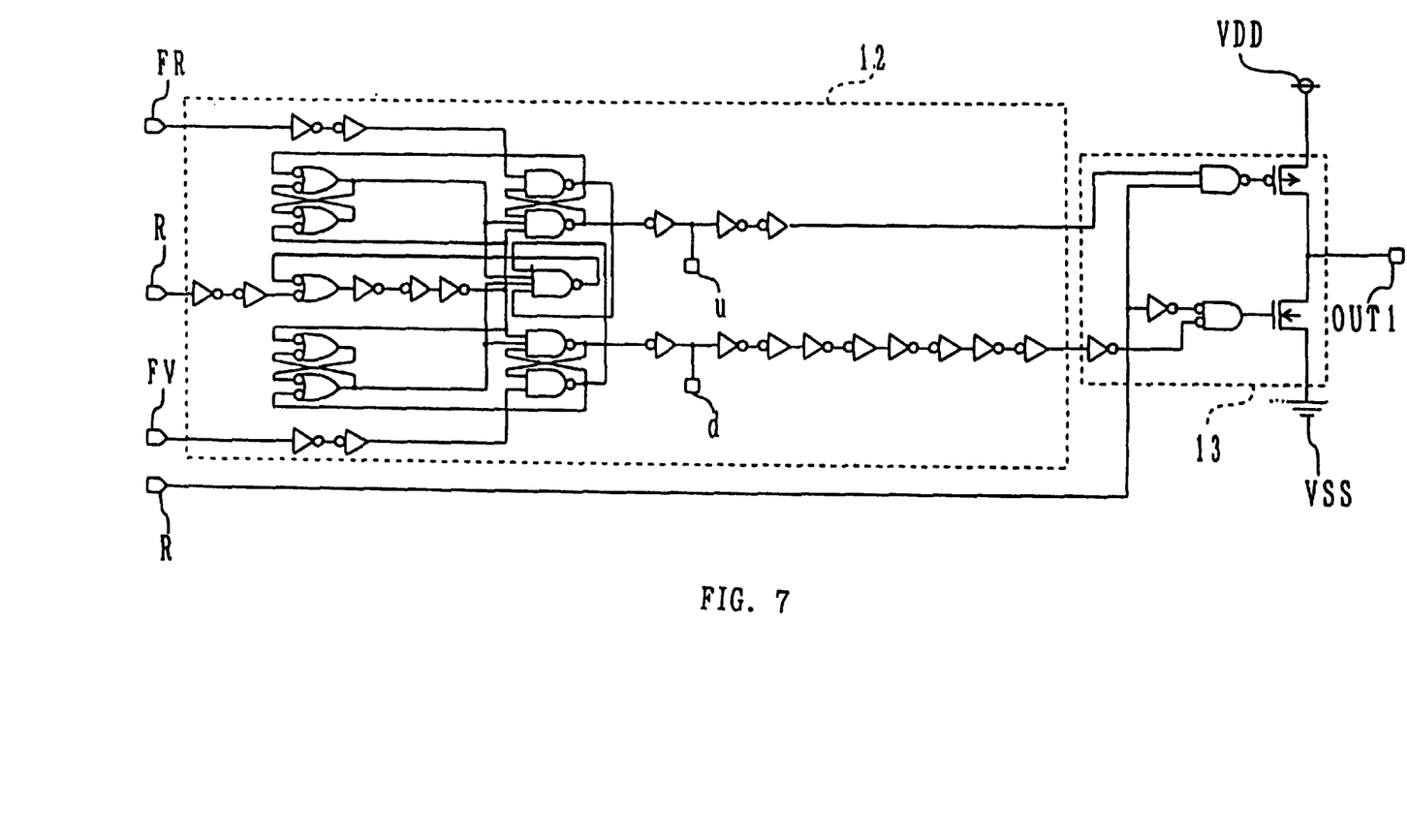
FIG. 7 is a diagram for explanation of a configuration of main part of the circuitry of FIG. 6.
Figure 8:
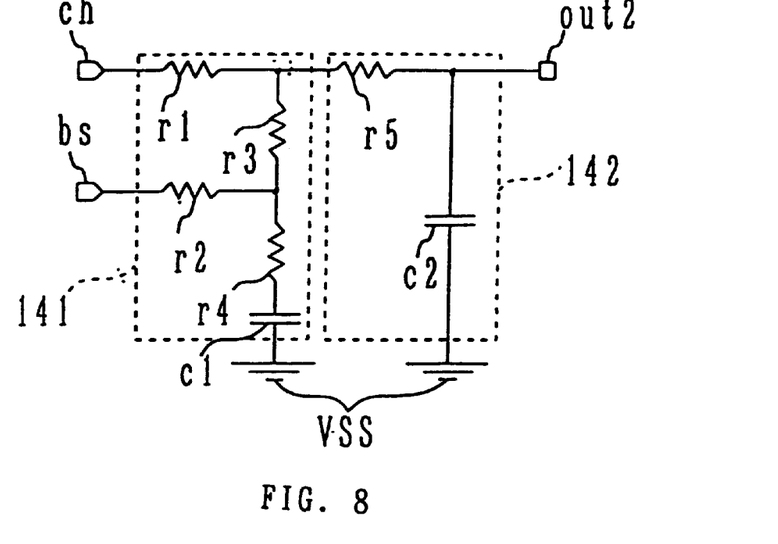
FIG. 8 is a diagram for explanation of a configuration of main part of the circuit of FIG. 6.
Figure 9:
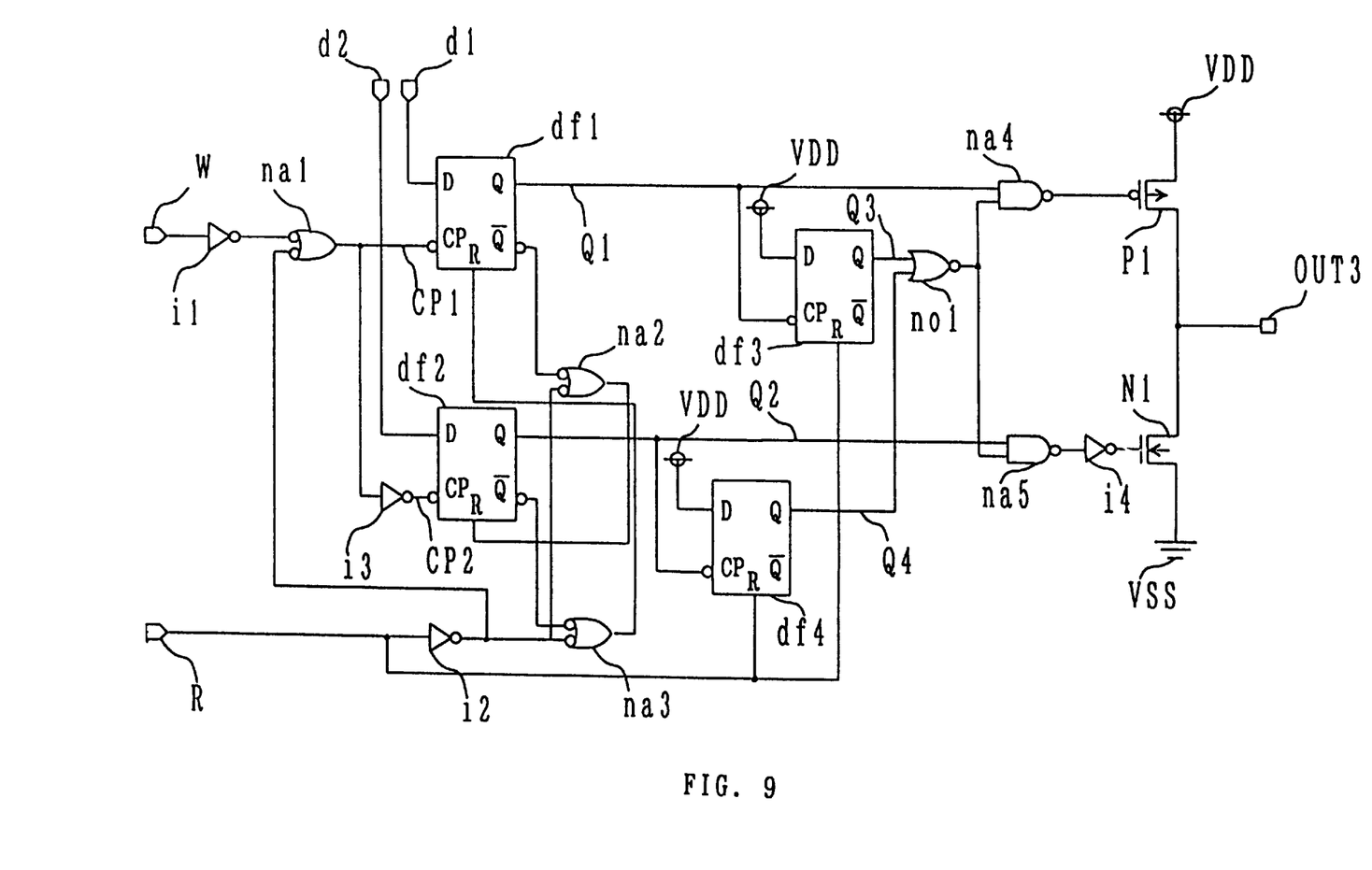
FIG. 9 is a diagram for explanation of a configuration of main part of the circuit of FIG. 6.

A configuration of this embodiment will first be explained with reference to FIG. 6. In the drawing, like parts or components are designated by like reference numerals used in FIG. 1. In FIG. 6, numeral 12 designates a phase comparator circuit whereas numeral 13 denotes a charge pump circuit. Practical configurations of these phase comparator 12 and charge pump 13 are shown in FIG. 7. The phase comparator 12 consists of a combination of plural NAND gates and inverters in such a manner that it receives the signals "A" and "B" at its terminals FR, FV: when the signal A advances the signal B in phase, the phase comparator outputs at a terminal "u" an error signal corresponding to such phase difference therebetween; otherwise, when signal A is behind signal B in phase, it outputs at a terminal "d" a corresponding error signal. The charge pump 13 includes a PMOS transistor and an NMOS transistor which are serially connected to each other between power supply terminals VDD, VSS with the drains thereof being connected together at a common node which is in turn coupled to an output terminal OUT1. These PMOS and NMOS transistors are operable to turn on and off in response to the error signals fed from the terminals "u" and "d" of phase comparator 5, respectively, to thereby supply power supply to a low-pass filter (LPF) circuit described infra. Note in FIG. 7 that a terminal R is the reset terminal which is for inputting a reset signal of an oscillation control circuit (not shown) to reset the phase comparator 12 and charge pump circuit 13. Numeral 14 designates the LPF which may consist of two stages of integration circuits 141, 142 as shown in FIG. 8. The first stage of integrator 141 consists of resistors r1–r4 and a capacitive element c1 with an output of the charge pump 13 being applied to one terminal "ch" of resistor r1 and with a boost voltage from a later-described boost circuit being applied to one terminal "bs" of resistor r2. The second stage integrator 142 consists of a resistor R5 and a capacitive element c2 and generates a control voltage at an output terminal OUT2. Numeral 15 of FIG. 6 denotes the boost circuit which is configured as shown in FIG. 9, wherein it includes D-type flip-flop circuits df1–df4, NAND gates na1–na5, NOR gate no1, inverters i1–i4, NMOS transistor N1, and PMOS transistor P1. The boost circuit 15 receives a window signal at an input terminal of the inverter i1 while receiving at terminals d1, d2 the error signals from the terminals u, d of phase comparator 12, respectively, for generating at an output terminal OUT3 an output voltage corresponding to respective signals.

An operation of this embodiment will next be explained below.

Figure 10:
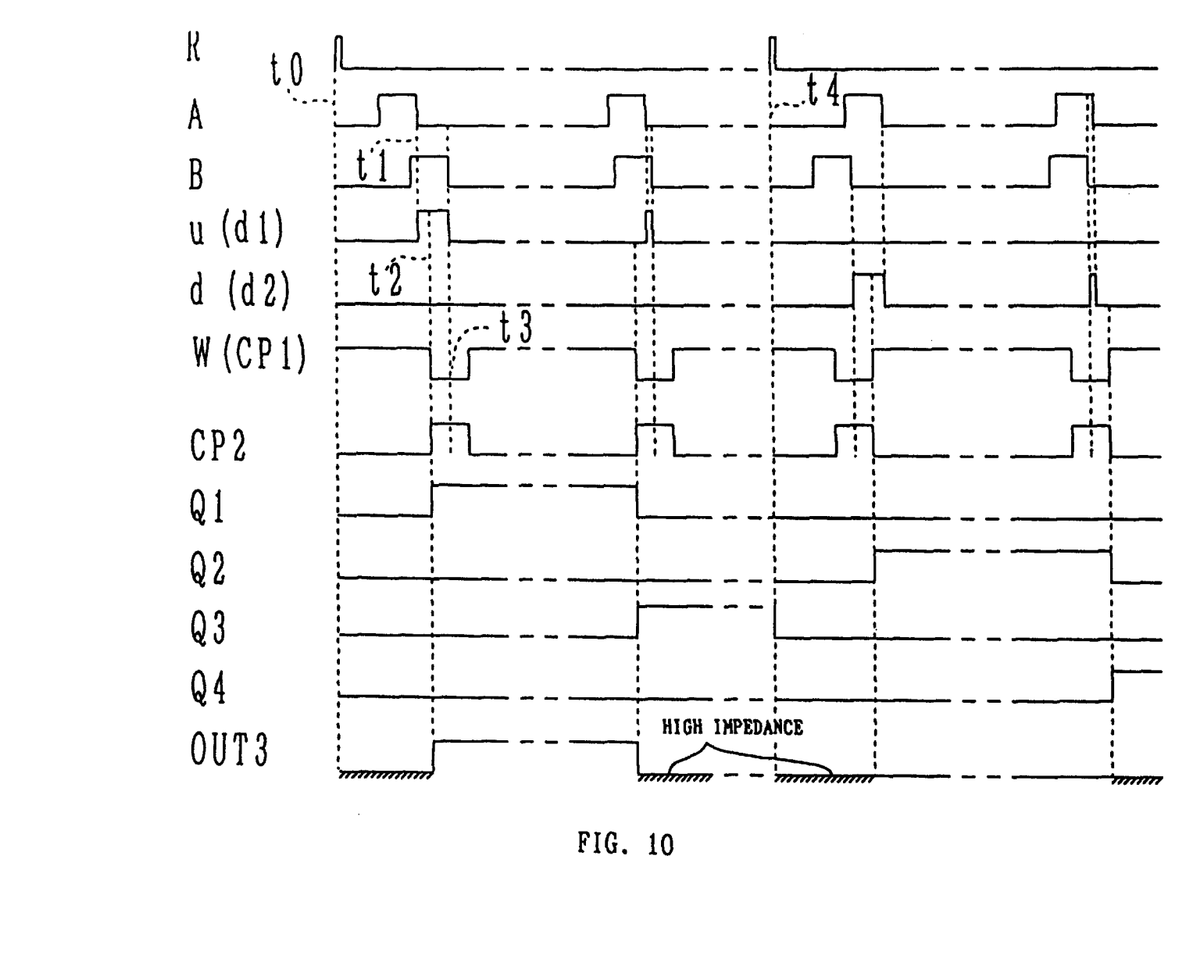
FIG. 10 is a timing chart for explanation of an operation of the FIG. 6 circuit.

FIG. 10 is a timing chart for explanation of the operation of this embodiment, wherein like reference numerals are used to designate like signals shown in FIG. 3. Suppose that the PLL circuit of this embodiment is rendered operative at a time point t0 of FIG. 10. Note that at this timing, the operation gets started after resetting the entire PLL circuit of this embodiment in response to a reset signal R. Whereby, the D-flip-flops df1–df4 are held in the reset state, the output of NOR gate no1 is at "H" level, the PMOS transistor P1 and NMOS transistor N2 are both turned off, the output terminal OUT3 is of high impedance, and the LPF 14 receives only the output from charge pump 13.

Figure 11:
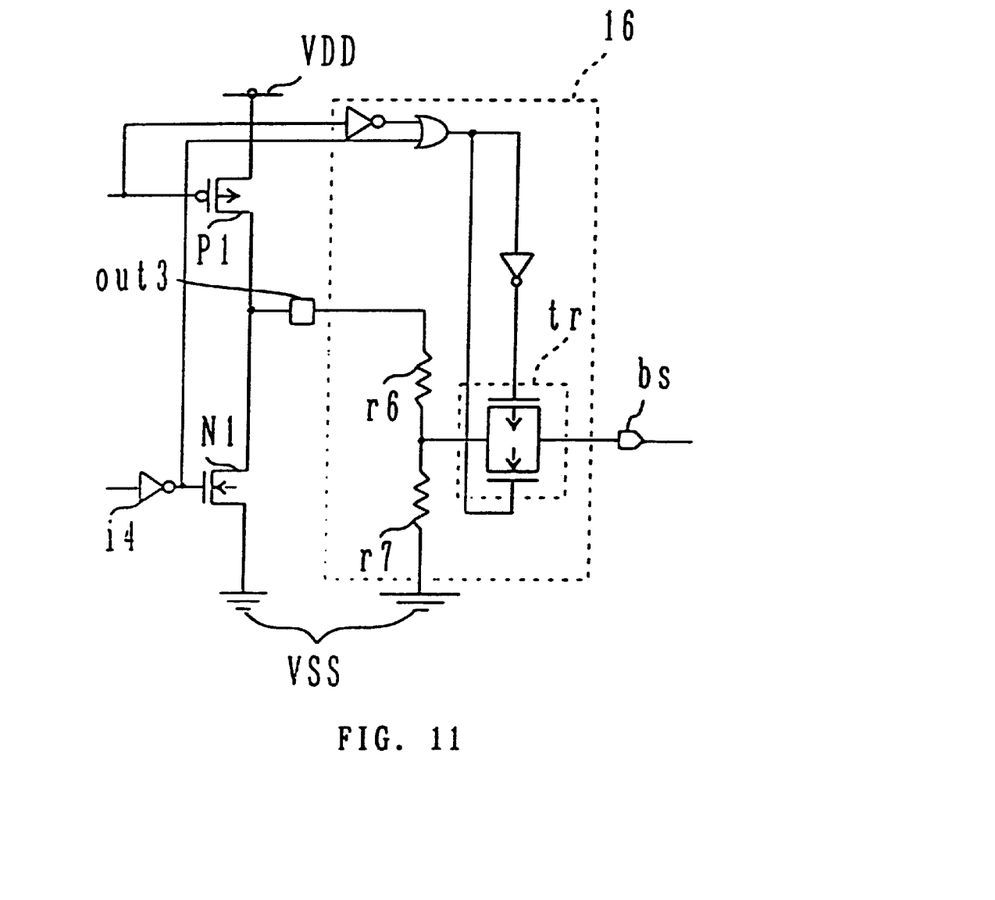
FIG. 11 is a diagram for explanation of a modification of the main part of FIG. 6.

Assuming that the signal B is behind the signal A in phase immediately after initiation of operation, the resultant error signal "u" potentially rises up to "H" level at a time point t1. Then, a window signal W is generated at a time t2. The D-flip-flop df1 receives this signal at its clock terminal CP1 through the inverter i1 and NAND gate na1 and then latches the signal "H" from terminal "u" which is being received at a data terminal d1 in a way synchronized with the falling edge of window signal W thereby causing the output signal to go high at "H" level as shown by "Q1" in FIG. 10. The signal Q1 is passed via NAND gate na4 to PMOS transistor P1 causing this transistor to turn on. Whereby, the terminal OUT3 is potentially pulled toward the power supply terminal VDD side so that the resulting voltage is applied as the boost voltage to the terminal bs of LPF 14. Note here that the control voltage value of VCO 3 as used for generation of a target frequency is set at the voltage value of power supply terminal VDD. Note also that if a control voltage value lower than this value is needed, the control voltage may be output via an associative voltage divider circuit that converts the output of the output terminal OUT3 into an appropriate voltage value. One example is that a voltage divider circuit 16 shown in FIG. 11 is provided coupling the output terminal OUT3 to power supply terminal VSS through a series circuit of two voltage-division resistors r6, r7 while causing a common node of these two resistors to act as an output terminal whose output is supplied to the terminal bs via a transmission gate "tr" associated therewith. Additionally, FIG. 11 employs similar reference characters to similar parts or elements which are the same as those shown in FIGS. 8 and 9. Preferably, the circuitry may be configured in such a way that the transmission gate tr closes forcing the terminal BS side in the high impedance state at the timing when the output terminal OUT3 is of high impedance in the operation shown in FIG. 10.

Turning back to FIG. 8, the capacitor c1 is charged up by the error signal from the charge pump 13 and also by the boost voltage so that the boost voltage is near the control voltage value as required for the target frequency (here, the voltage value of the power supply terminal VDD). Whereby, a phase difference between the signals A, B decreases allowing the error signal "u" to fall within the pulse width of window signal W; at this time—i.e. at a time t3—the window signal W attempts to rise in potential prior to a potential increase of error signal u at the "H" level so that the D flip-flop df1 operates to read the "L" state of terminal d1 letting the signal Q1 drop down at "L" level. This results in that the PMOS transistor P1 turns off, and the output terminal OUT3 is in the high impedance state thus permitting the LPF 14 to receive the output of charge pump 13 only. Due to such potential drop of the signal Q1 the D-flip-flop df3 behaves to latch the "H" level signal being received at its data terminal d3 (this signal is potentially pulled toward the power supply VDD) generating an output signal Q3 of "H" level. In responding, the NOR gate no1 potentially fixes its output signal at "L" level. Due to this, even upon later occurrence of a window signal u which does not fall within the pulse width of window signal W, the booster circuit 15 holds the output terminal OUT3 in the high impedance state with no output voltage being generated. In other words, this embodiment is specifically arranged to make use of the boost voltage only for a single time immediately after the initiation of operation. This scheme is for eliminating undesirable occurrence of overshoot and undershoot due to excessive use of the boost voltage as originated from generation of certain error signals that slightly exceed the pulse width of the window signal, which may in turn suppress excess charge up of the capacitor c1. More specifically, where the value of such boost voltage is fixed by the LPF 14 at a single voltage value, overshoot and undershoot may readily take place when compared to the case of performing fine or precise boost voltage settings as in the first embodiment; to avoid this problem, the second embodiment employs the "one-time use" scheme that limits the use of boost voltage only for a single time. In other words, this embodiment avoids the necessity of carrying out any fine boost voltage setting or adjustment reducing complexity of circuit configuration and thus decreasing production cost.

It is to be noted that the operation mode discussed herein assumes that the PLL circuit of this embodiment is restarted after a time t4 and that the signal B advances signal A in phase. In this case the error signal d can appear at the terminal d of phase comparator 12. The D-flip-flop df2 that receives this error signal d at its terminal d2 also receives at clock terminal CP2 a signal corresponding to an inverted version of the window signal W, and latches the state of such data terminal d2 at the timing of the falling edge thereof causing the output signal Q2 to go high in potential. When this is done, another D-flip-flop df4 receives the output signal Q2 at its clock terminal and latches the state of data terminal d4 at the falling edge of this signal. Whereby, where the error signal d does not reside within the pulse width of window signal W, the NMOS transistor N1 is rendered conductive letting the output terminal OUT3 potentially drop down at "L" level. The terminal BS of LPF 14 is thus pulled in potential toward the power supply terminal VSS to thereby permit the control voltage to rapidly decrease in value as compared to the case of exclusive reception of the output of charge pump 13. The output terminal OUT3 is in the high impedance state when the error signal d is within the pulse width of window signal W. Even in this case, when the output terminal OUT3 is at the "L" level exhibiting the high impedance state, this terminal will remain high in impedance thereafter.

While the foregoing explanation has been presented under an assumption that the boost voltage is to be used when the operation of PLL circuit gets started, the circuitry may be modified such that the boost voltage is also used when resetting of the D-flip-flops df3, df4 when the VCO 3 is changed in frequency.

It should be apparent from the foregoing description that the second embodiment may simplify the boost voltage value setting by limiting the use of such boost voltage while at the same time offering capability of attaining high-speed lockup operations in a way similar to that of the first embodiment discussed supra.

One significant advantage of the present invention lies in capability of performing high-speed and reliable frequency transition.

In particular, with the PLL circuitry as designed to set the boost voltage in deference to the target frequency and make use of such boost voltage in response to occurrence of a specified phase difference, it becomes possible to speed up an intended frequency transition over the entire frequency band of PLL circuit. This may in turn render the PLL circuit design readily modifiable in conformity with any possible change or alteration of specification of the VCO circuit used therein thus reducing costs thereof.

A further advantage of the invention is that limiting the use of the boost voltage for a single time may eliminate or at least greatly suppress occurrence of unwanted overshooting and undershooting phenomena without having to carry out too fine or precise boost-voltage settings thus rendering attainable the PLL circuit capable of effectuating high-speed frequency transition with cost much reduced.

Although the invention has been disclosed and illustrated with reference to particular embodiments, the principles involved are susceptible for use in numerous other embodiments, modification and alterations which will be apparent to persons skilled in the art to which the invention pertains. The invention is, therefore, to be limited only as indicated by the scope of the appended claims.

What is claimed is:

1. A phase-locked loop circuit comprising:
   a reference signal source for generating a reference frequency signal;
   a first frequency divider circuit for frequency-dividing said reference frequency signal as output from said reference signal source;
   a voltage-controlled oscillator circuit for outputting an output signal with a frequency responsive to a control voltage;
   a second frequency divider circuit for frequency-dividing said output signal of said voltage-controlled oscillator circuit;
   a phase comparator circuit for phase comparison of respective output signals of said first and second frequency divider circuits with each other to thereby output an error signal with a pulse width corresponding to a phase difference therebetween, if any;
   a charge pump circuit as driven in response to said error signal as output from said phase comparator circuit;

a low-pass filter circuit having an integration circuit, for averaging an output of said charge pump circuit to output an averaged signal as said control voltage; and a control circuit for monitoring the error signal and for applying, in response to occurrence of a phase difference greater than or equal to a predetermined value, a boost voltage corresponding to said phase difference to a capacitive element of the integration circuit of said low-pass filter.

2. A phase-locked loop circuit according to claim 1, wherein said control circuit generates, when the pulse width of said error signal is greater than or equal to said predetermined value, said boost voltage having a value near said control voltage for use in causing said voltage-controlled oscillator circuit to oscillate at a target frequency.

3. A phase-locked loop circuit according to claim 1, wherein said control circuit generates a window signal used for pulse-width comparison of said error signal and generates, when said pulse width of said error signal is greater than or equal to said predetermined value during comparison of said window signal with said error signal, said boost voltage based on preset level-set data in order to set said boost voltage at certain value near said control voltage value for use in forcing said voltage-controlled oscillator circuit to oscillate at said target frequency.

4. A phase-locked loop circuit according to claim 3, wherein said control circuit includes a storage circuit storing therein said level-set data along with set data including a frequency division ratio of said first frequency divider circuit and/or said second frequency divider circuit, and performs a setting of said boost voltage while setting said frequency division ratio.

5. A phase-locked loop circuit comprising:

a reference signal source for generating a reference frequency signal;

a first frequency divider circuit for frequency-dividing said reference frequency signal as output from said reference signal source;

a voltage-controlled oscillator circuit for outputting an output signal with a frequency responsive to a control voltage;

a second frequency divider circuit for frequency-dividing said output signal of said voltage-controlled oscillator circuit;

a phase comparator circuit for phase comparison of respective output signals of said first and second frequency divider circuits to each other thereby outputting an error signal with a pulse width corresponding to a phase difference therebetween if any;

a charge pump circuit as driven in response to said error signal as output from said phase comparator circuit;

a low-pass filter circuit having an integration circuit for averaging an output signal of said charge pump circuit to output an averaged signal as said control voltage; and a control circuit for monitoring said error signal, for applying a boost voltage to a capacitive element of said integration circuit of said low-pass filter while said phase difference is beyond a specified value, and for eliminating application of said boost voltage even where said phase difference again goes beyond said specified value after interruption of boost voltage application.

* * * * *